(12) United States Patent
Bonwick et al.

(10) Patent No.: US 7,496,586 B1
(45) Date of Patent: Feb. 24, 2009

(54) METHOD AND APPARATUS FOR COMPRESSING DATA IN A FILE SYSTEM

(75) Inventors: Jeffrey S. Bonwick, Los Altos, CA (US); Matthew A. Ahrens, San Francisco, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 638 days.

(21) Appl. No.: 10/853,868

(22) Filed: May 26, 2004

(51) Int. Cl.
*G06F 7/00* (2006.01)
*G06F 17/00* (2006.01)
*G06F 12/00* (2006.01)
*G06F 17/30* (2006.01)

(52) U.S. Cl. ........................ 707/101; 707/200
(58) Field of Classification Search ................ 711/170; 714/723; 709/227; 707/101, 200
See application file for complete search history.

(56) References Cited

U.S. PATENT DOCUMENTS

| | | | |
|---|---|---|---|
| 4,144,522 A | | 3/1979 | Kageyama et al. |
| 5,129,085 A | | 7/1992 | Yamasaki et al. |
| 5,155,847 A | | 10/1992 | Kirouac et al. |
| 5,371,885 A | | 12/1994 | Letwin |
| 5,403,639 A | | 4/1995 | Belsan |
| 5,410,667 A | | 4/1995 | Belsan |
| 5,675,802 A | | 10/1997 | Allen et al. |
| 5,819,292 A | | 10/1998 | Hitz et al. |
| 6,145,069 A | * | 11/2000 | Dye .......................... 711/170 |
| 6,209,111 B1 | | 3/2001 | Kadyk et al. |
| 6,341,341 B1 | | 1/2002 | Grummon et al. |
| 6,745,284 B1 | | 6/2004 | Lee et al. |
| 6,745,305 B2 | | 6/2004 | McDowell |
| 6,795,966 B1 | | 9/2004 | Lim et al. |
| 6,829,617 B2 | | 12/2004 | Sawdon et al. |
| 6,857,001 B2 | | 2/2005 | Hitz |
| 6,892,211 B2 | | 5/2005 | Hitz |
| 7,007,196 B2 | | 2/2006 | Lee et al. |
| 7,032,154 B2 | | 4/2006 | Kidorf et al. |
| 7,043,677 B1 | | 5/2006 | Li |
| 7,133,964 B2 | | 11/2006 | Rodrigues |
| 7,162,486 B2 | | 1/2007 | Alexander |
| 7,174,352 B2 | | 2/2007 | Kleiman |
| 7,200,603 B1 | * | 4/2007 | Hitz et al. .................... 707/101 |
| 7,200,715 B2 | | 4/2007 | Kleiman |
| 7,231,564 B2 | * | 6/2007 | Loaiza et al. ................ 714/723 |

(Continued)

OTHER PUBLICATIONS

Sandberg, R. et al.; "Design and Implementation of the Sun Network Filesystem"; Sun Microsystems, Inc., 1985 USENIX Conference (12 pages).

(Continued)

*Primary Examiner*—Hung T. Vy
*Assistant Examiner*—Patrick A Darno
(74) *Attorney, Agent, or Firm*—Osha • Liang LLP (57) ABSTRACT

A method for storing a data block, comprising compressing the data block using a first compression algorithm to obtain a compressed data block, generating a data block compression header, combining the compressed data and the data compression header to obtain a compressed data block package, storing the compressed data block package in a storage pool, obtaining a compressed data block package location, calculating a data block checksum for the compressed data block, and storing a first indirect block in the storage pool, wherein the first indirect block comprises the compressed data block package location, the data block checksum, and a compression flag.

12 Claims, 8 Drawing Sheets

U.S. PATENT DOCUMENTS

| | | |
|---|---|---|
| 2002/0004883 A1 | 1/2002 | Nguyen et al. |
| 2002/0055942 A1 | 5/2002 | Reynolds |
| 2002/0087788 A1 | 7/2002 | Morris |
| 2002/0161972 A1 | 10/2002 | Talagale et al. |
| 2003/0033477 A1 | 2/2003 | Johnson et al. |
| 2003/0126107 A1 | 7/2003 | Yamagami |
| 2003/0145167 A1 | 7/2003 | Tomita |
| 2003/0177243 A1* | 9/2003 | Collette et al. .............. 709/227 |
| 2004/0098720 A1 | 5/2004 | Hooper |
| 2004/0107314 A1 | 6/2004 | Kim et al. |
| 2004/0123063 A1 | 6/2004 | Dalal et al. |
| 2004/0225834 A1 | 11/2004 | Lu et al. |
| 2004/0234000 A1 | 11/2004 | Page |
| 2005/0010620 A1 | 1/2005 | Silvers et al. |
| 2005/0097270 A1 | 5/2005 | Kleiman et al. |
| 2005/0235154 A1 | 10/2005 | Serret-Avila |
| 2006/0168409 A1 | 7/2006 | Kahn et al. |
| 2006/0218644 A1 | 9/2006 | Niles et al. |
| 2006/0256965 A1 | 11/2006 | Rowe |
| 2008/0133872 A1* | 6/2008 | Fair ........................... 711/204 |

OTHER PUBLICATIONS

McKusick, M. K. et al.; "A Fast File System for UNIX"; ACM Transaction on Computer Systems, vol. 2, No. 3, Aug. 1984, pp. 181-197 (17 pages).

Astrahan, M.M. et al.; "System R: Relational Approach to Database Management"; ACM Transactions on Database Systems, vol. 1, No. 2, Jun. 1976, pp. 97-137 (41 pages).

"VERITAS File System 3.4 Administrator's Guide" VERITAS Software Corporation, Nov. 2000, http://www.veritas.com; pp. 1-227 (227 pages).

Czezatke C. et al.; "Linlogfs: A Log-Structured Filesystem for Linux"; The USENIX Association, Proceedings of FREENIX Track: 2000 USENIX Annual Technical Conference, San Diego, California, Jun. 18-23, 2000 (13 pages).

Osorio, N. et al.; "Guidelines for Using Snapshot Storage Systems for Oracle Databases"; Oracle Corporation, Oct. 2001 (13 pages).

Quinlan, S.; "A Cached WORM File System"; AT&T Bell Laboratories, Murry Hill, New Jersey; Software-Practice and Experience, vol. 21(12), pp. 1289-1299, Dec. 1991 (11 pages).

Sun StorEdge Instant Image 2.0 System Administrator's Guide; Sun Microsystems, Inc., Feb. 2000, Revision A (106 pages).

Ylonen, T.; "Concurrent Shadow Paging: A New Direction for Database Research"; Laboratory of Information Processing Science, Helsinki University of Technology, SF-02150, Espoo, Finland, 1992 (8 pages).

Popek, G. et al.; "The LOCUS Distributed System Architecture"; The MIT Press, Cambridge, Massachusetts, 1985 The Massachusetts Institute of Technology (8 pages).

Gray, J. et al.; "The Recovery Manager of the System R Database Manager"; Computing Surveys, vol. 13, No. 2, Jun. 1981 (20 pages).

Schilling, J.; "Enrwurf und Implementierung eines schnellen Filesystems fur Unix unter besonderer Berucksichtigung der technischen Parameter optischer Speichermedien und multimedialer Anwendungen"; Diplomarbeir Jorg Schilling, eingereicht am 23.05. 1991 an der TU Berlin, and English Translation (245 pages).

Ylonen, T.; "Concurrent Shadow Paging: Snapshots, Read-Only Transactions, and On-The-Fly Multi-Level Incremental Dumping"; Laboratory of Information Processing Science, Helsinki University of Technology, FIN-02150, Espoo, Finland, 1993 (22 pages).

"The Enterprise Challenge Served by Snapshot"; Whitepaper, 2001 LSI Logic Corporation (8 pages).

Agrawal, R. et al.; "Integrated Concurrency Control and Recovery Mechanisms: Design and Performance Evaluation"; ACM Transactions on Database Systems, vol. 10, No. 4, Dec. 1985, pp. 529-564 (36 pages).

Suresh, Babu S.; "Persistent Snapshots"; Department of Computer Science and Automation, Indian Institute of Science, Bangalore—560 012, Jan. 2000 (38 pages).

"Proceedings of the 5th Annual Linux Showcase & Conference" USENIX Association, Oakland, California, Nov. 5-10, 2001 (11 pages).

Borg, A. et al.; "Fault Tolerance Under UNIX"; ACM Transactions on Computer Systems, vol. 7, No. 1, Feb. 1989, pp. 1-24 (24 pages).

Rosenblum, M. et al.; "The Design and Implementation of a Log-Structured File System"; Electrical Engineering and Computer Sciences, Computer Science Division, Univeristy of California, 1991 (15 pages).

Hecht, M. S. et al.; "Shadowed Management of Free Disk Pages with a Linked List"; ACM Transactions on Database Systems, vol. 8, No. 4, Dec. 1983, pp. 503-514 (12 pages).

Rosenblum, M. et al.; "The LFS Storage Manager" Computer Science Division, Electrical Engineering and Computer Sciences, University of California; presented at the Summer '90 USENIX Technical Conference, Anaheim, California, Jun. 1990 (16 pages).

Lorie, R. A.; "Physical Integrity in a Large Segmented Database"; ACM Transactions on Database Systems, vol. 2, No. 1, Mar. 1977, pp. 91-104 (14 pages).

Johnson, J. E. et al.; "Overview of the Spiralog File System", Digital Technical Journal, vol. 8, No. 2, 1996, pp. 5-14 (10 pages).

Santry, D. S. et al.; "Deciding When to Forget in the Elephant File System"; 17th ACM Symposium on Operating Systems Principles (SOSP '99), Dec. 1999; pp. 110-123 (14 pages).

Chutani, S. et al., "The Episode File System"; Proceedings of the 1992 USENIX Winter Technical Conference; 1992; (18 pages).

Seltzer, M.L.; "File System Performance and Transaction Support"; University of California at Berkeley, 1992 (131 pages).

Austin, B.; "A Dynamic Disc Allocation Algorithm Designed to Reduce Fragmentation During File Reloading"; Information Sciences Laboratory, Corporate Research and Development Center, General Electric Company, 1970 (4 pages).

Goodheart, B. et al.; "The Magic Garden Explained"; Prentice Hall, 1994 (8 pages).

Stallings, W.; "Computer Organization and Architecture: Designing for Performance"; Prentice Hall, 2000 (4 pages).

* cited by examiner

METHOD AND APPARATUS FOR COMPRESSING DATA IN A FILE SYSTEM

BACKGROUND

A typical operating system includes a file system. The file system provides a mechanism for the storage and retrieval of files and a hierarchical directory structure for the naming of multiple files. More specifically, the file system stores information provided by the user (i.e., data) and information describing the characteristics of the data (i.e., metadata). The file system also provides extensive programming interfaces to enable the creation and deletion of files, reading and writing of files, performing seeks within a file, creating and deleting directories, managing directory contents, etc. In addition, the file system also provides management interfaces to create and delete file systems. File systems are typically controlled and restricted by operating system parameters. For example, most operating systems limit the maximum number of file names that can be handled within their file system. Some operating systems also limit the size of files that can be managed under a file system.

An application, which may reside on the local system (i.e., computer) or may be located on a remote system, uses files as an abstraction to address data. Conventionally, this data is stored on a storage device, such as a disk.

To access a file, the operating system (via the file system) typically provides file manipulation interfaces to open, close, read, and write the data within each file. More specifically, the file system stores data on the storage device by managing the allocation of space within the storage device. Typically, the volume manager provides space which is managed by the file system. Two common types of file system space allocation strategies are known as block-based allocation and extent-based allocation. Block-based allocation creates incremental disk space for each file each time the file is extended (i.e., modified via a write request to add information), whereas extent-based allocation creates a large series of contiguous blocks (i.e., extents) each time the file exhausts the space available in the file's last extent.

When allocating space, both block-based and extent-based allocation use space provided by the volume manager. The volume manager allows multiple physical disks to be used as a single volume (i.e., a virtual disk) to provide larger consolidated storage sizes and simpler management. The volume manager allows users to organize data along volume boundaries (i.e., each volume has physical disk space allocated to the volume such that the volume is tied only to that dedicated physical disk). The volume manager is typically implemented as a separate layer between the physical disks and the file system, and is presented to the user as a virtual disk device. In other words, volume managers organize the collections of physical devices (e.g., disks) into virtual devices. Additionally, the space allocated within the volume manager is handled by the file system. Consequently, the volume manager is not aware of which blocks within the available storage space are in use and which blocks are free for data to be stored.

Further, file systems may be mounted on the virtual disk devices. Thus, physical disks are partitioned and allocated to multiple virtual disk devices, and each virtual disk device is capable of having a file system that exclusively uses that particular virtual disk device. A request to access a file is typically performed by an application, via the file system, using a file name and logical offset. This file name and logical offset (i.e., the manner in which applications express file operation requests) corresponds to a location within the virtual disk device. Subsequently, the request is translated to physical disk space on the storage device by the volume manager, allowing the user of the application to access the data within a particular file.

File systems may also include a mechanism to decrease the amount of data stored in the file system. One such mechanism is compression. Compression is process in which a compression algorithm is applied to the file to reduce the size of the file. The compression algorithm may be as simple as removing all extra space characters, inserting a single repeat character to indicate a string of repeated characters, and substituting smaller bit strings for frequently occurring characters. Typically, a file system applies a compression algorithm to the file that a user wishes to store in the file system. A compressed version of the file is subsequently stored. When the file (or a portion of the file) is request by the user, the file system decompresses the entire file and places the file in a read buffer. Once user has finished using the file (or the portion of the file requested by the user), the entire file is compressed and stored in file system.

SUMMARY

In general, in one aspect, the invention relates to a method for storing a data block, comprising compressing the data block using a first compression algorithm to obtain a compressed data block, generating a data block compression header, combining the compressed data and the data compression header to obtain a compressed data block package, storing the compressed data block package in a storage pool, obtaining a compressed data block package location, calculating a data block checksum for the compressed data block, and storing a first indirect block in the storage pool, wherein the first indirect block comprises the compressed data block package location, the data block checksum, and a compression flag.

In general, in one aspect, the invention relates to a method for storing a data block, comprising compressing the data block using a first compression algorithm to obtain a compressed data block, storing the compressed data block in a storage pool, generating a data block compression header, combining the compressed data and the data compression header to obtain a compressed data block package, storing the compressed data block package in a storage pool, obtaining a compressed data block package location, calculating a data block checksum for the compressed data block, assembling a first indirect block, wherein the wherein the first indirect block comprises the compressed data block package location, the data block checksum, and a compression flag corresponding to the compressed data block, compressing the first indirect block using a second compression algorithm to obtain a compressed indirect block, generating an indirect block compression header, combining the compressed indirect block and the indirect block compression header to obtain a compressed indirect block package, and storing the compressed indirect block package.

In general, in one aspect, the invention relates to a method for retrieving a data block, comprising obtaining an indirect block comprising a block pointer, if the block pointer contains a compression flag set to a predetermined value, obtaining a compressed data block using a compressed data block package location stored in the block pointer, calculating a checksum for the compressed data block to obtain a calculated checksum, retrieving data from the data block, if the data block checksum stored in the block pointer equals the calculated checksum, decompressing the compressed data block to obtain the data block using a data compression header in the compressed data block package, if the data block checksum stored in the block pointer equals the calculated checksum, and performing an appropriate action, if the data block checksum stored in the block pointer equals the calculated checksum, and if the block pointer does not contain a compression flag set to a predetermined value, obtaining the data block using a data block location stored in the block pointer, calculating the checksum for the data block to obtain a calculated checksum, retrieving data from the data block, if the data block checksum stored in the block pointer equals the calculated checksum, and performing an appropriate action, if the checksum is not equal to the calculated checksum.

In general, in one aspect, the invention relates to a system for storing a compressed data block, comprising a storage pool comprising a compressed data block package and a first indirect block, wherein the compressed data block package comprises the compressed data block and a data block compression header, and wherein the first indirect block comprises a data block checksum, a compression flag, and a compressed data block package location, and a storage pool allocator configured to store the compressed data block and the first indirect block in the storage pool.

In general, in one aspect, the invention relates to a system, comprising a storage pool comprising a file system, wherein the file system comprises a plurality of child blocks, wherein each of the plurality of child blocks comprises one selected from the group consisting of a data block, a compressed data block package, an indirect block, and compressed indirect block package, wherein each the indirect block and each compressed indirect block package references at least one of the plurality of child blocks, a root block referencing at least one of the plurality of child blocks, wherein the root block comprises a root checksum obtained using at least one of the plurality of child blocks, wherein each indirect block and each compressed indirect block package comprises a compression flag and a child block checksum obtained using at least one of the plurality of child blocks, and a storage pool allocator configured to store the root block and the plurality of child blocks in the storage pool.

In general, in one aspect, the invention relates to a computer system for storing a data block comprising a processor, memory, a storage device, and software instructions stored in the memory for enabling the computer system under control of the processor, to compress the data block using a first compression algorithm to obtain a compressed data block, generate a data block compression header, combine the compressed data and the data compression header to obtain a compressed data block package, store the compressed data block package in a storage pool, obtain a compressed data block package location, calculate a data block checksum for the compressed data block, and store a first indirect block in the storage pool, wherein the first indirect block comprises the compressed data block package location, the data block checksum, and a compression flag.

In general, in one aspect, the invention relates to a computer system for retrieving a data block, comprising a processor, a memory, a storage device, and software instructions stored in the memory for enabling the computer system under control of the processor, to obtain an indirect block comprising a block pointer if the block pointer contains a compression flag set to a predetermined value, obtain a compressed data block using a compressed data block package location stored in the block pointer, calculate a checksum for the compressed data block to obtain a calculated checksum, retrieve data from the data block, if the data block checksum stored in the block pointer equals the calculated checksum, decompress the compressed data block to obtain the data block using a data compression header in the compressed data block package, if the data block checksum stored in the block pointer equals the calculated checksum, and perform an appropriate action, if the data block checksum stored in the block pointer equals the calculated checksum, and if the block pointer does not contain a compression flag set to a predetermined value, obtain the data block using a data block location stored in the block pointer, calculate the checksum for the data block to obtain a calculated checksum, retrieve data from the data block, if the data block checksum stored in the block pointer equals the calculated checksum, and perform an appropriate action, if the checksum is not equal to the calculated checksum.

In general, in one aspect, the invention relates to a plurality of nodes, comprising a storage pool comprising a compressed data block package and a first indirect block, wherein the compressed data block package comprises the compressed data block and a data block compression header, and wherein the first indirect block comprises a data block checksum, a compression flag, and a compressed data block package location, and a storage pool allocator configured to store the compressed data block and the first indirect block in the storage pool, wherein the storage pool is located on any one of the plurality of nodes, and wherein the storage pool allocator is located on any one of the plurality of nodes.

In general, in one aspect, the invention relates to a plurality of nodes, comprising a storage pool comprising a file system, wherein the file system comprises, a plurality of child blocks, wherein each of the plurality of child blocks comprises one selected from the group consisting of a data block, a compressed data block package, an indirect block, and compressed indirect block package, wherein each the indirect block and each compressed indirect block package references at least one of the plurality of child blocks, a root block referencing at least one of the plurality of child blocks, wherein the root block comprises a root checksum obtained using at least one of the plurality of child blocks, wherein each indirect block and each compressed indirect block package comprises a compression flag and a child block checksum obtained using at least one of the plurality of child blocks, and a storage pool allocator configured to store the root block and the plurality of child blocks in the storage pool, wherein the storage pool is located on any one of the plurality of nodes, and wherein the storage pool allocator is located on any one of the plurality of nodes.

Other aspects of the invention will be apparent from the following description and the appended claims.

DETAILED DESCRIPTION

Exemplary embodiments of the invention will be described with reference to the accompanying drawings. Like items in the drawings are shown with the same reference numbers.

In the following description, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

In general, one or more embodiments of the invention provide a method and apparatus for compressing files in a file system. More specifically, one or more embodiments of the invention provide a method and apparatus for compressing files at the block level within the file system. Further, one or more embodiments of the invention provides a method and apparatus to decompress a portion of the file stored in the file system.

Figure 1:
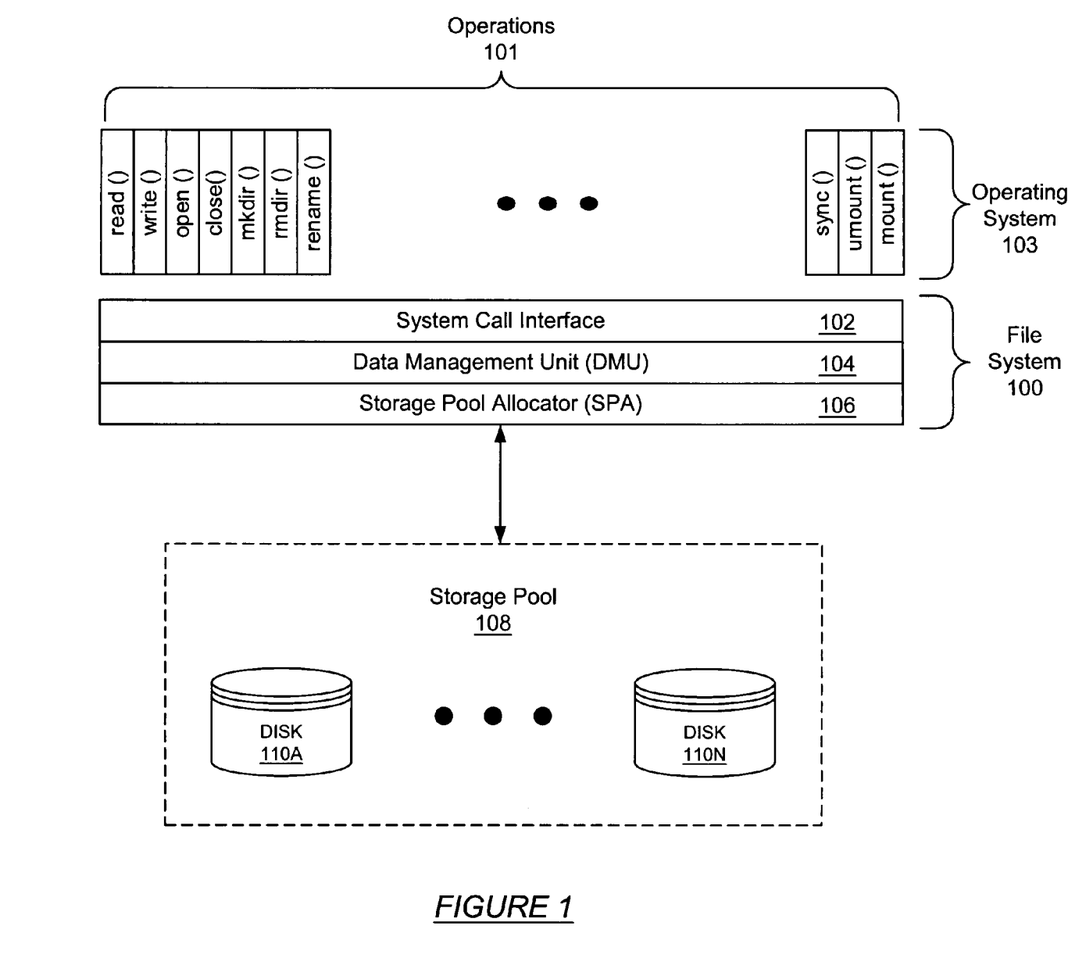
FIG. 1 shows a system architecture in accordance with an embodiment of the invention.

FIG. 1 shows a system architecture in accordance with one embodiment of the invention. The system architecture includes an operating system (103) interacting with a file system (100), which in turn interfaces with a storage pool (108). In one embodiment of the invention, the file system (100) includes a system call interface (102), a data management unit (DMU) (104), and a storage pool allocator (SPA) (106).

The operating system (103) typically interfaces with the file system (100) via a system call interface (102). The operating system (103) provides operations (101) for users to access files within the file system (100). These operations (101) may include read, write, open, close, etc. In one embodiment of the invention, the file system (100) is an object-based file system (i.e., both data and metadata are stored as objects). More specifically, the file system (100) includes functionality to store both data and corresponding metadata in the storage pool (108). Thus, the aforementioned operations (101) provided by the operating system (103) correspond to operations on objects.

More specifically, in one embodiment of the invention, a request to perform a particular operation (101) (i.e., a transaction) is forwarded from the operating system (103), via the system call interface (102), to the DMU (104). In one embodiment of the invention, the DMU (104) translates the request to perform an operation on an object directly to a request to perform a read or write operation at a physical location within the storage pool (108). More specifically, the DMU (104) represents the objects as data blocks and indirect blocks as described in FIG. 3 below. Additionally, in one embodiment of the invention, the DMU (104) includes functionality to group related work (i.e., modifications to data blocks and indirect blocks) into I/O requests allowing related blocks to be forwarded to the SPA (106) together. The SPA (106) receives transactions from the DMU (106) and subsequently writes the blocks into the storage pool (108). The operation of the SPA (106) is described in FIG. 2 below.

In one embodiment of the invention, the storage pool (108) includes one or more physical disks (disks (110A-110N)). Further, in one embodiment of the invention, the storage capacity of the storage pool (108) may increase and decrease dynamically as physical disks are added and removed from the storage pool. In one embodiment of the invention, the storage space available in the storage pool (108) is managed by the SPA (106).

Figure 2:
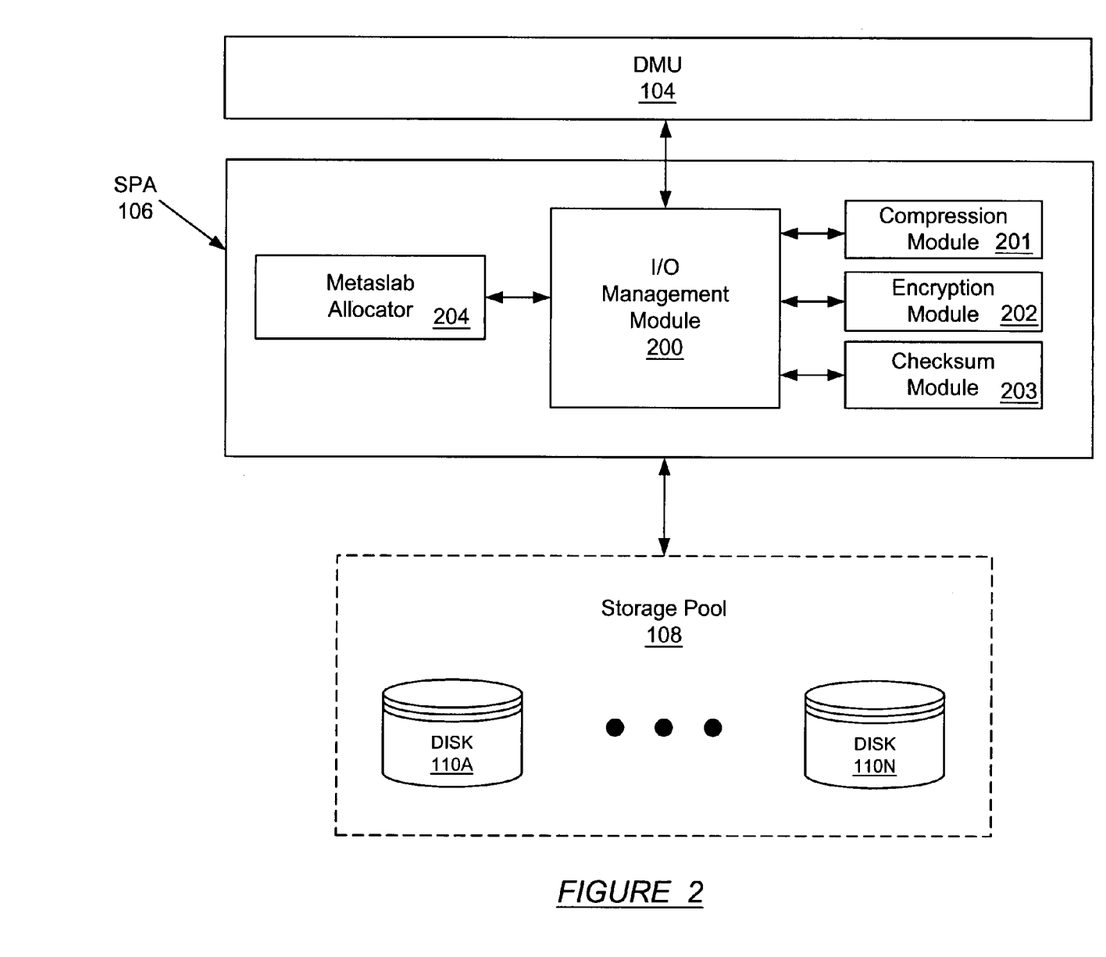
FIG. 2 shows a storage pool allocator in accordance with an embodiment of the invention.
Figure 3A:
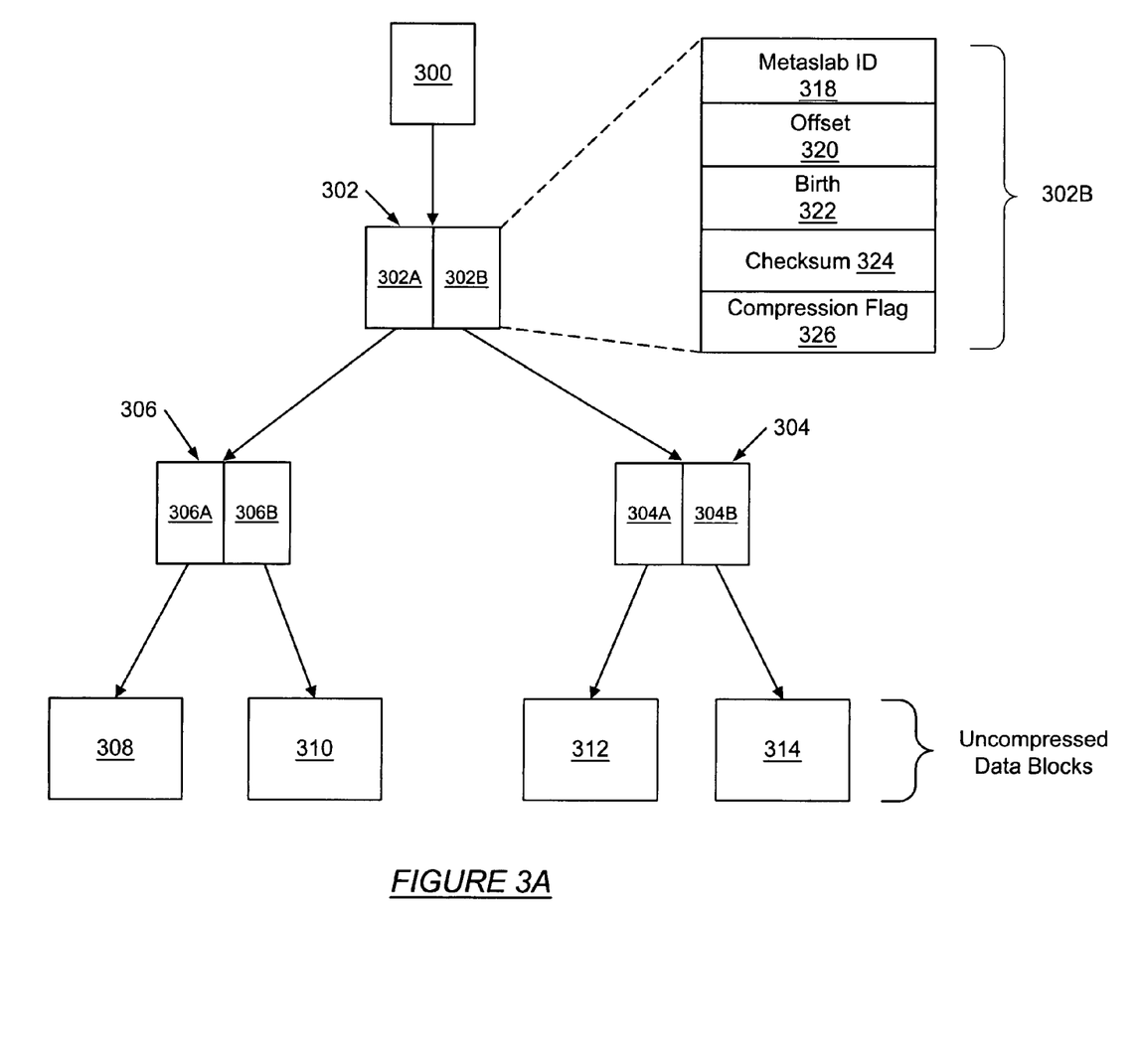
FIG. 3A shows a hierarchical data configuration in accordance with an embodiment of the invention.

FIG. 2 shows the SPA (106) in accordance with one embodiment of the invention. The SPA (106) may include an I/O management module (200), a compression module (201), an encryption module (202), a checksum module (203), and a metaslab allocator (204). Each of these aforementioned modules in detail below.

As noted above, the SPA (106) receives transactions from the DMU (104). More specifically, the I/O management module (200), within the SPA (106), receives transactions from the DMU (104) and groups the transactions into transaction groups in accordance with one embodiment of the invention. The compression module (201) provides functionality to compress larger logical blocks (i.e., data blocks and indirect blocks) into smaller segments, where a segment is a region of physical disk space. For example, a logical block size of 8K bytes may be compressed to a size of 2K bytes for efficient storage. Further, the compression module (201) may include one or more compression algorithms which may be used to compress the blocks (i.e., data blocks and indirect blocks). Further, the compression algorithms present in the compression module (201) may be modified at anytime during the life of the file system (e.g., from the time the file system is initialized until the file system is no longer in use).

Further, in one embodiment of the invention, the encryption module (202) provides various data encryption algorithms. The data encryption algorithms may be used, for example, to prevent unauthorized access. In one embodiment of the invention, the checksum module (203) includes functionality to calculate a checksum for data (i.e., data stored in a data block) and metadata (i.e., data stored in an indirect block) within the storage pool. The checksum may be used, for example, to ensure data has not been corrupted.

As discussed above, the SPA (106) provides an interface to the storage pool and manages allocation of storage space within the storage pool (108). More specifically, in one embodiment of the invention, the SPA (106) uses the metaslab allocator (204) to manage the allocation of storage space in the storage pool (108).

In one embodiment of the invention, the storage space in the storage pool is divided into contiguous regions of data, i.e., metaslabs. The metaslabs may in turn be divided into segments (i.e., portions of the metaslab). The segments may all be the same size, or alternatively, may be a range of sizes. The metaslab allocator (204) includes functionality to allocate large or small segments to store data blocks and indirect blocks.

In one embodiment of the invention, allocation of the segments within the metaslabs is based on the size of the blocks within the I/O requests. That is, small segments are allocated for small blocks, while large segments are allocated for large blocks. The allocation of segments based on the size of the blocks may allow for more efficient storage of data and metadata in the storage pool by reducing the amount of unused space within a given metaslab. Further, using large segments for large blocks may allow for more efficient access to data (and metadata) by reducing the number of DMU (104) translations and/or reducing the number of I/O operations. In one embodiment of the invention, the metaslab allocator may include a policy that specifies a method to allocate segments.

As noted above, the storage pool (108) is divided into metaslabs, which are further divided into segments. Each of the segments within the metaslab may then be used to store a data block (i.e., data) or an indirect block (i.e., metadata). FIG. 3A shows the hierarchical data configuration (hereinafter referred to as a "tree") for storing data blocks and indirect blocks within the storage pool in accordance with one embodiment of the invention. In one embodiment of the invention, the tree includes a root block (300), one or more levels of indirect blocks (302, 304, 306), and one or more data blocks (308, 310, 312, 314).

In one embodiment of the invention, the location of the root block (300) is in a particular location within the storage pool. The root block (300) typically points to subsequent indirect blocks (302, 304, and 306). In one embodiment of the invention, indirect blocks (302, 304, and 306) may be arrays of block pointers (e.g., 302A, 302B, etc.) that, directly or indirectly, reference to data blocks (308, 310, 312, and 314). The data blocks (308, 310, 312, and 314) contain actual data of files stored in the storage pool. One skilled in the art will appreciate that several layers of indirect blocks may exist between the root block (300) and the data blocks (308, 310, 312, 314). Though not explicitly shown in FIG. 3, each of the data blocks (308, 310, 312, 314), each of the indirect blocks (302, 304, 306), and the root block (300) may be stored in compressed form within the tree.

In contrast to the root block (300), indirect blocks and data blocks may be located anywhere in the storage pool (108 in FIG. 1). In one embodiment of the invention, the root block (300) and each block pointer (e.g., 302A, 302B, etc.) includes data as shown in the expanded block pointer (302B). One skilled in the art will appreciate that data blocks do not include this information; rather data blocks contain actual data of files within the file system.

In one embodiment of the invention, each block pointer includes a metaslab ID (318), an offset (320) within the metaslab, a birth value (322), a checksum (324) of the data stored in the block (data block or indirect block) referenced by the block pointer, and a compression flag (326). In one embodiment of the invention, the metaslab ID (318) and offset (320) are used to determine the location of the, referenced by the block pointer, in the storage pool. The metaslab ID (318) identifies a particular metaslab.

More specifically, the metaslab ID (318) may identify the particular disk (within the storage pool) upon which the metaslab resides and where in the disk the metaslab begins. The offset (320) may then be used to reference a particular segment in the metaslab. In one embodiment of the invention, the data within the segment referenced by the particular metaslab ID (318) and offset (320) may correspond to either a data block or an indirect block. If the data corresponds to an indirect block, then the metaslab ID and offset within the block pointer in the indirect block are extracted and used to locate a subsequent data block or indirect block. The tree may be traversed in this manner to eventually retrieve a requested data block.

In one embodiment of the invention, copy-on-write transactions are performed for every data write request to a file. Specifically, all write requests cause new segments to be allocated for the modified data. Therefore, the retrieved data blocks and indirect blocks are never overwritten (until a modified version of the data block and indirect block is committed). More specifically, the DMU writes out all the modified data blocks in the tree to unused segments within the storage pool. Subsequently, the DMU writes out the corresponding block pointers (within indirect blocks) to unused segments in the storage pool. In one embodiment of the invention, fields (i.e., metaslab ID, offset, birth, checksum, compression information) for the corresponding block pointers are populated by the DMU prior to sending an I/O request to the SPA. The indirect blocks containing the block pointers are typically written one level at a time. To complete the copy-on-write transaction, the SPA issues a single write that atomically changes the root block to reference the indirect blocks referencing the modified data block.

Figure 3B:
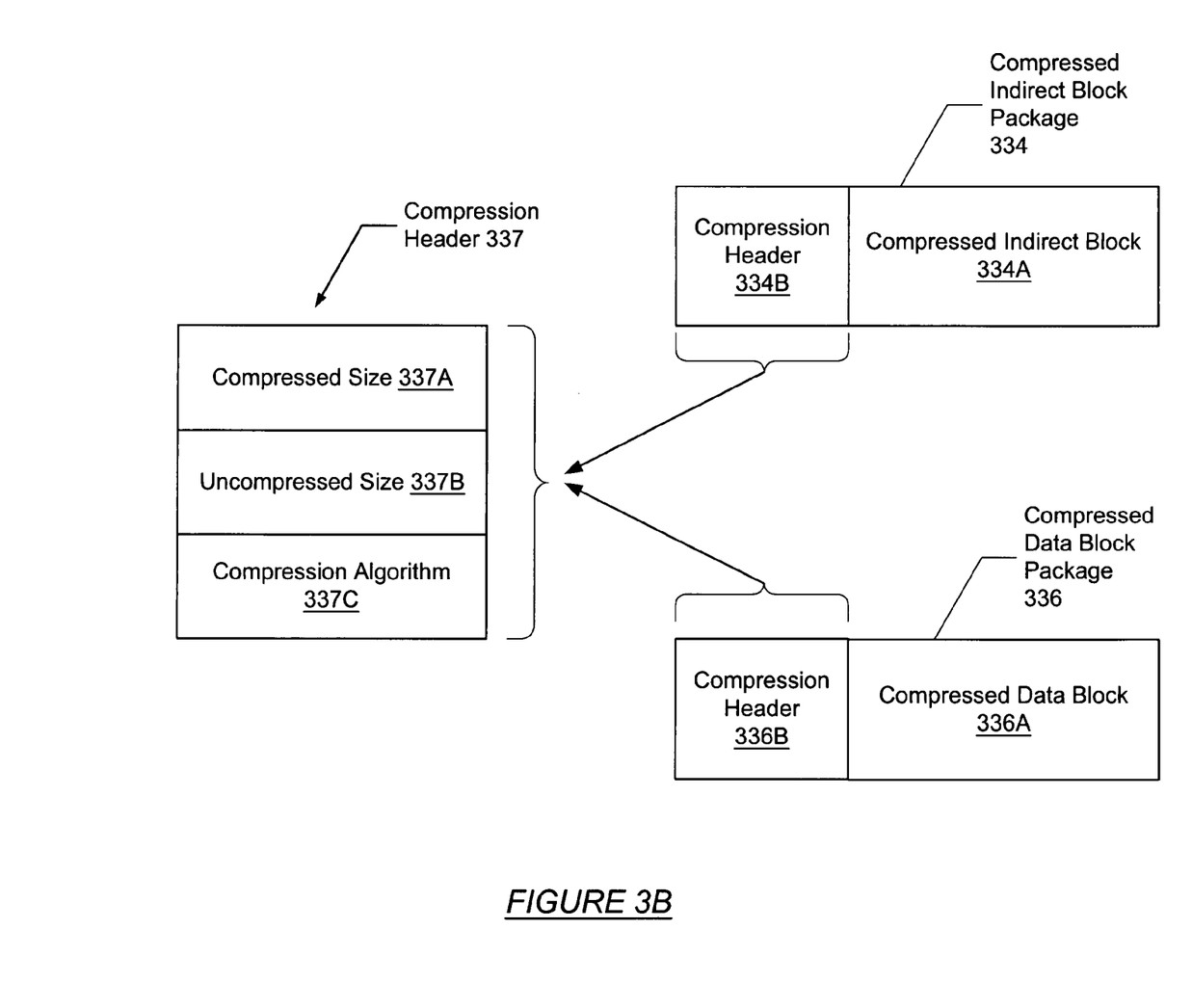
FIG. 3B shows a layout of compressed blocks in accordance with one embodiment of the invention.

Continuing with the discussion of FIG. 3A, the compression flag (326) indicates whether the block referenced by the block pointer is compressed. In one embodiment of the invention, the compression flag (326) corresponds to a one bit value, where a value of zero indicates that the block (data block or indirect block) referenced by the block pointer is not compressed. However, if the block (data block or indirect block) referenced by the block pointer is compressed, the compression flag (326) is set to one. The data blocks and indirect blocks shown in FIG. 3A, represent those blocks in their uncompressed form. FIG. 3B shows a layout of compressed blocks in accordance with one embodiment of the invention. In particular, when a data block is compressed, the compressed data block (336A) is stored as a component of a compressed data block package (336). In addition to the compressed data block (336A), the compressed data block package (336) also includes a corresponding compression header (336B). Similarly, a compressed indirect block (334A) is stored as a component of a compressed indirect block package (334). In addition to the compressed indirect block (334A), the compressed indirect block package (334) includes a corresponding compression header (334B). In one embodiment of the invention, the fields in the compression header, for both the compressed data block package (336) and the compressed indirect block package (334) are the same.

Specifically, the compression header (337) includes a compressed size (337A) field, an uncompressed size (337B) field, and a compression algorithm field (337C). The compressed size (337A) corresponds to the size of the compressed data block (336A) or compressed indirect block (334A). The uncompressed size (337B) corresponds to the size of the uncompressed data block or uncompressed indirect block. The compression algorithm (337C) indicates the compression algorithm used to compress the data block or the indirect block.

Figure 4:
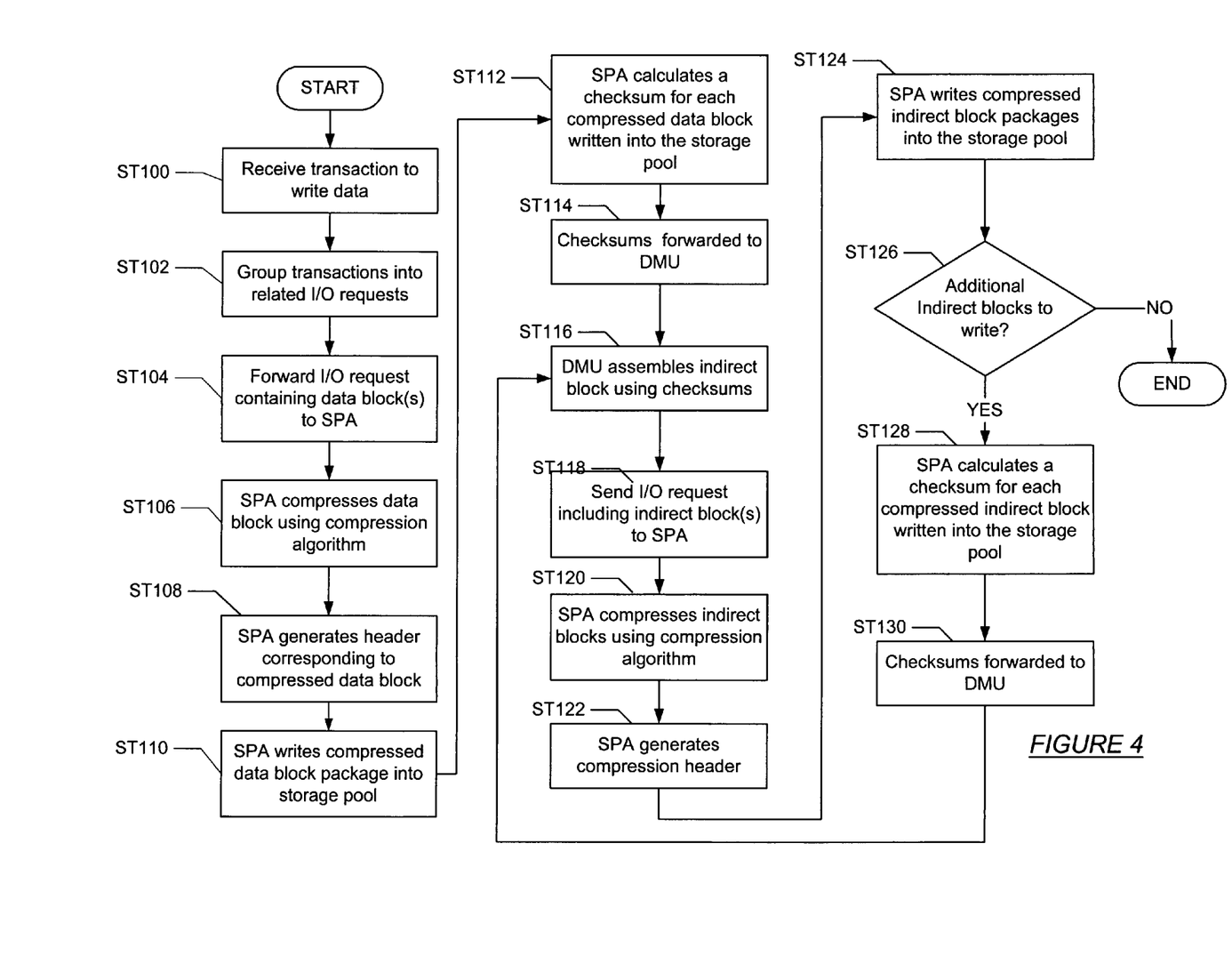
FIG. 4 shows a flow chart in accordance with an embodiment of the invention.

Using the infrastructure shown in FIGS. 1-3B, the following discussion describes a method for compressing a block in the file system in accordance with one embodiment of the invention. FIG. 4 shows a flow chart in accordance with one embodiment of the invention. Initially, the DMU receives a transaction from an application, the operating system (or a subsystem therein), etc., to write data into the storage pool (ST 100). The DMU subsequently groups transactions into one or more I/O requests (ST 102). The I/O requests are subsequently forwarded to the SPA (ST 104).

In one embodiment of the invention, the transaction includes one or more data blocks, and/or one or more indirect blocks. As noted above, the file system is stored on disk using a hierarchical structure including data blocks and indirect blocks. Thus, for a given set of transactions, the first I/O request includes the data blocks to be written to disk, while subsequent I/O requests include the corresponding indirect blocks containing one or more block pointers. Accordingly, the I/O request referenced in ST 104 includes data blocks. In one embodiment of the invention, the request from the DMU may also include a request to compress the block (i.e., data block or indirect block) prior to storing the block in the storage pool. In one embodiment of the invention, the DMU may also specify the compression algorithm to use. Alternatively, the DMU may merely request that the blocks are compressed prior to storing them in the storage pool and allow the SPA to determine what compression algorithm to use.

Alternatively, the file system may include functionality to activate and deactivate the compression functionality. In this scenario, all blocks are compressed prior to being stored in the storage pool, and the DMU does not have to explicitly request the SPA to compress the blocks. Further, the SPA may use only one compression algorithm to compress all the blocks when the compression functionality is activated. Alternatively, the SPA may include functionality to determine the best compression algorithm to use for the particular block.

Continuing with the discussion of FIG. 4, the SPA, upon receiving the I/O request including data blocks from the DMU, compresses the data block using a compression algorithm (ST 106). The SPA then generates a compression header corresponding with the compressed data block (ST108). The compressed data block along with the compression header is subsequently stored in the storage pool as a compressed data block package (ST110). The SPA subsequently calculates a checksum for each compressed data block written into the storage pool (ST 110). In one embodiment, the checksum module (203 in FIG. 2) within the SPA is used to calculate the checksum for each compressed data block written into the storage pool. The checksums are subsequently forwarded to the DMU (ST 114).

The DMU then assembles the indirect blocks using the checksums (ST 116). Specifically, the DMU places the checksum in the appropriate block pointer within the indirect block (i.e., the parent indirect block of the data block). In addition, if the block referenced by the indirect block is compressed then, the DMU also sets the compression flag during the assembly of the indirect blocks.

Once the indirect blocks are assembled, the indirect blocks are forwarded to the SPA (ST 118). Those skilled in the art will appreciate that the aforementioned indirect blocks correspond to the indirect blocks that directly point (via the block pointers) to the data blocks (as opposed to indirect blocks that point to other indirect blocks). Next, the SPA compresses the indirect blocks using a compression algorithm (ST 120). The SPA then generates a compression header corresponding with the compressed indirect blocks (ST122). The compressed indirect blocks along with the compression header are subsequently stored in the storage pool as a compressed indirect block package (ST124).

A determination is then made as to whether additional indirect blocks exist to write into the storage pool (i.e., whether the last indirect block written to the storage pool corresponds to the root block) (ST 126). If no additional indirect blocks exist, then the method is complete. However, if additional indirect blocks exist, then the SPA calculates the checksum for each of the compressed indirect blocks written into the storage pool (ST 128). The checksums are subsequently forwarded to the DMU (ST 130). ST 116 through ST 126 are subsequently repeated until the root block is written into the storage pool.

Those skilled in the art will appreciate that while FIG. 4 described a method for compressing all blocks (data blocks and indirect blocks) in the file system, the invention may be implemented such that only certain blocks are compressed while others remain uncompressed. Further those skilled in the art will appreciate that each compressed block (data block or indirect block) may be compressed using a different compression algorithm.

Figure 5:
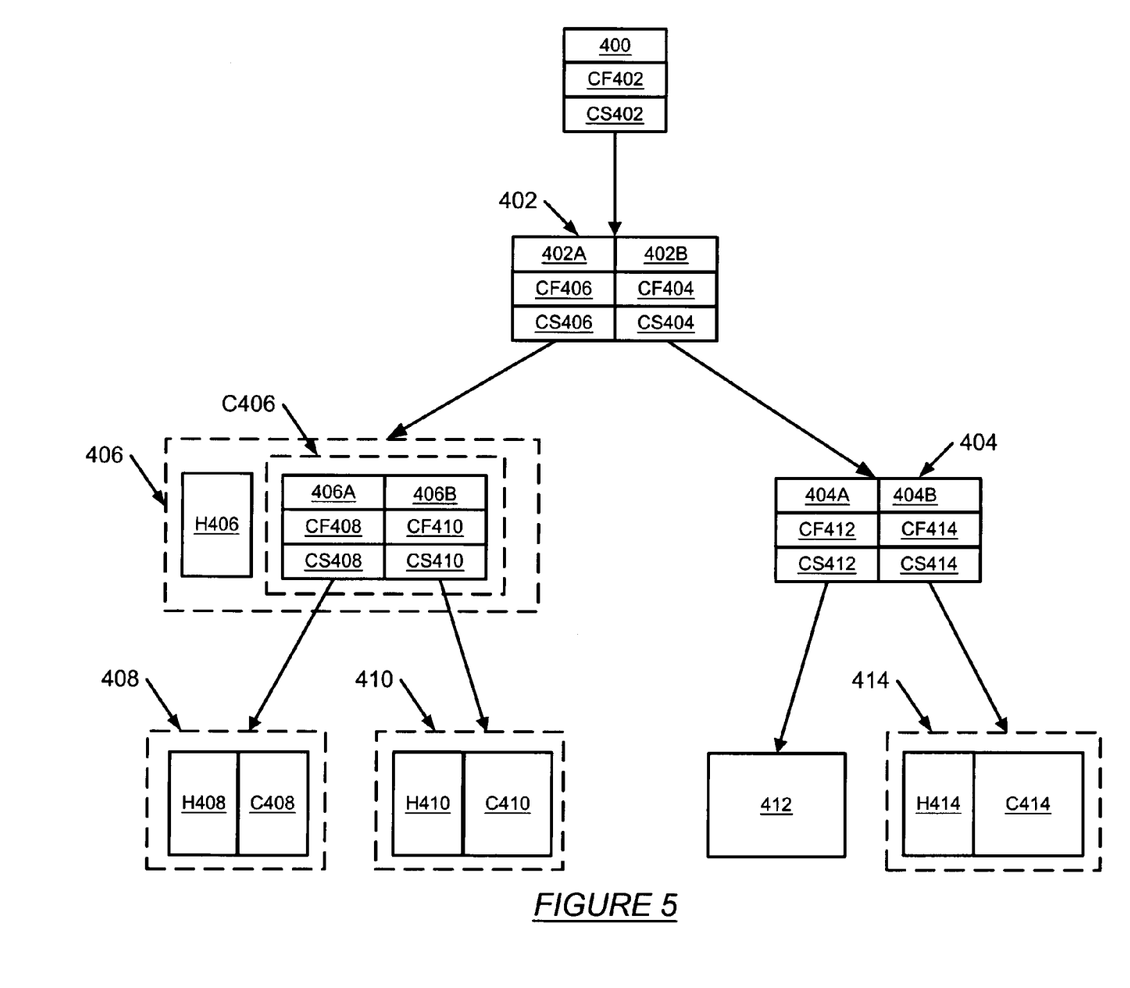
FIG. 5 shows a hierarchical data configuration in accordance with an embodiment of the invention.

FIG. 5 shows a hierarchical data configuration in accordance with an embodiment of the invention. Specifically, FIG. 5 shows a detailed view of the data blocks and indirect blocks resulting from using the method described in FIG. 4, in accordance with one embodiment of the invention. Specifically, the file system includes one uncompressed data block (412) and three compressed data blocks (i.e., C408, C410, and C414) stored within compressed data block packages (408, 410, and 414 respectively). Each of the compressed data block packages (408, 410, and 414) also includes corresponding compression headers (H408, H410, and H414, respectively).

Note that the compressed data blocks (e.g., C408, C410, and C414) may each have a different compressed size. Each data block (compressed or uncompressed) (408, 410, 412, and 414) has a corresponding checksum (CS408, CS410, CS412, and CS414) stored in a corresponding block pointer (i.e., block pointer (406A), block pointer (406B), block pointer (404A), block pointer (404B), respectively). Note that checksums (e.g., CS408, CS410, CS412, and CS414,) are calculated using the corresponding compressed data blocks.

Further, the block pointers (e.g., 406A, 406B, 404A, 404B) each include a compression flag (i.e., CF408, CF410, CF412, and CI414, respectively). In particular, the compression flag (i.e., CF408, CF410, and CI414, respectively) is set in the block pointers that referenced the compressed data blocks (i.e., C408, C410, and C414). Each of the block pointers (e.g., 406A, 406B, 404A, and 404B) is stored in an indirect block (i.e., 404, C406). In the hierarchy shown in FIG. 5, indirect block (C406) is compressed, thus block pointers (406A, 406B) located in indirect block (C406) are compressed. Further, because indirect block (406) is compressed, compressed indirect block (C406) is stored in a compressed indirect block package (406). The compressed indirect block package (406) includes a compression header (H406).

Each indirect block (compressed or uncompressed) (e.g., 404, C406) also has a corresponding checksum (e.g., CS404, CS406, respectively) stored in a corresponding block pointer in a parent indirect block (402). Specifically, block pointer (402A) includes the checksum (CS406) for indirect block (406), and block pointer (402B) includes the checksum (CS404) for indirect block (404). Further, (402A) includes the compression flag (CI406) for indirect block (406), and block pointer (402B) includes the compression flag (CF404) for indirect block (404). In this particular example, the indirect block (402) is referenced by a root block (400). The root block (400) includes the checksum (CS402) for the array of indirect blocks (402).

Figure 6:
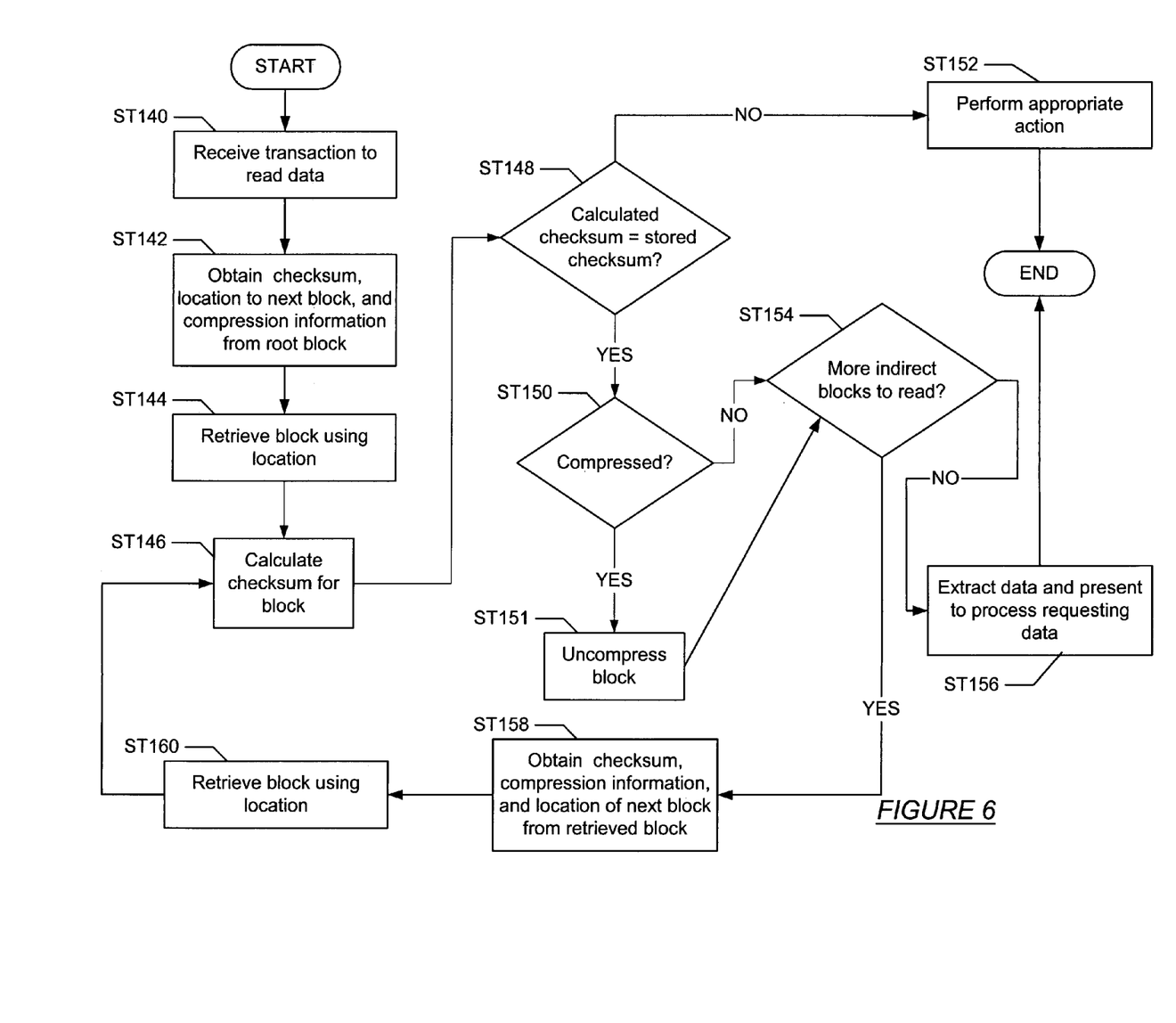
FIG. 6 shows a flow chart in accordance with an embodiment of the invention.

FIG. 6 shows a flow chart in accordance with one embodiment of the invention. More specifically, FIG. 6 details a method for reading data in accordance with one embodiment of the invention. Initially, a transaction to read data is received (ST 140). A checksum, compression flag, and a location to the next block (i.e., a data block or an indirect block) stored in the root block are subsequently retrieved (ST 142). Those skilled in the art will appreciate that if the block is compressed the location of the block corresponds to the location either the compressed data block package or the compressed indirect block package. The location (e.g., the metaslab ID and offset) is subsequently used to obtain the block (i.e., the data block or the indirect block) (ST 144). The checksum of the retrieved block is subsequently calculated (ST 146). Those skilled in the art will appreciate that the checksum may be calculated on compressed block if the blocks are compressed, or on uncompressed blocks if the blocks are uncompressed. A determination is subsequently made as to whether the stored checksum is equal to the calculated checksum (ST 148). If the stored checksum is not equal to the calculated checksum, then an appropriate action is performed (e.g., an error message is generated indicating that the data is corrupted) (ST 152).

If the stored checksum is equal to the calculated checksum, a determination is then made whether the retrieved block is compressed (ST 150). In one embodiment, the compression flag is used to determine whether the retrieved block is compressed. If the retrieved block is compressed, then the retrieved block is decompressed using the appropriate compression algorithm (ST 151). The compression algorithm used to compress the retrieved block may be obtained from the compression header associated with the block. Alternatively, if a default compression algorithm was used to compress the block, then the SPA use the default compression algorithm to decompress the block.

Once the block has been decompressed, or if the retrieved block was not stored in compressed form, a determination is made whether the retrieved block is a data block (ST 154). If the retrieved block is a data block, then the data is extracted from the data block and presented to the process requesting the data (ST 156). Alternatively, if the retrieved block is not the data block, then checksum, compression information, and the location of the next block (stored within a block pointer of the retrieved block) is obtained (ST 158). The block (data block or indirect block) at the location is subsequently obtained (ST 160). ST 146 through ST 160 are subsequently repeated until an error is encountered (ST 152) or the data block is encountered (ST 156).

Figure 7:
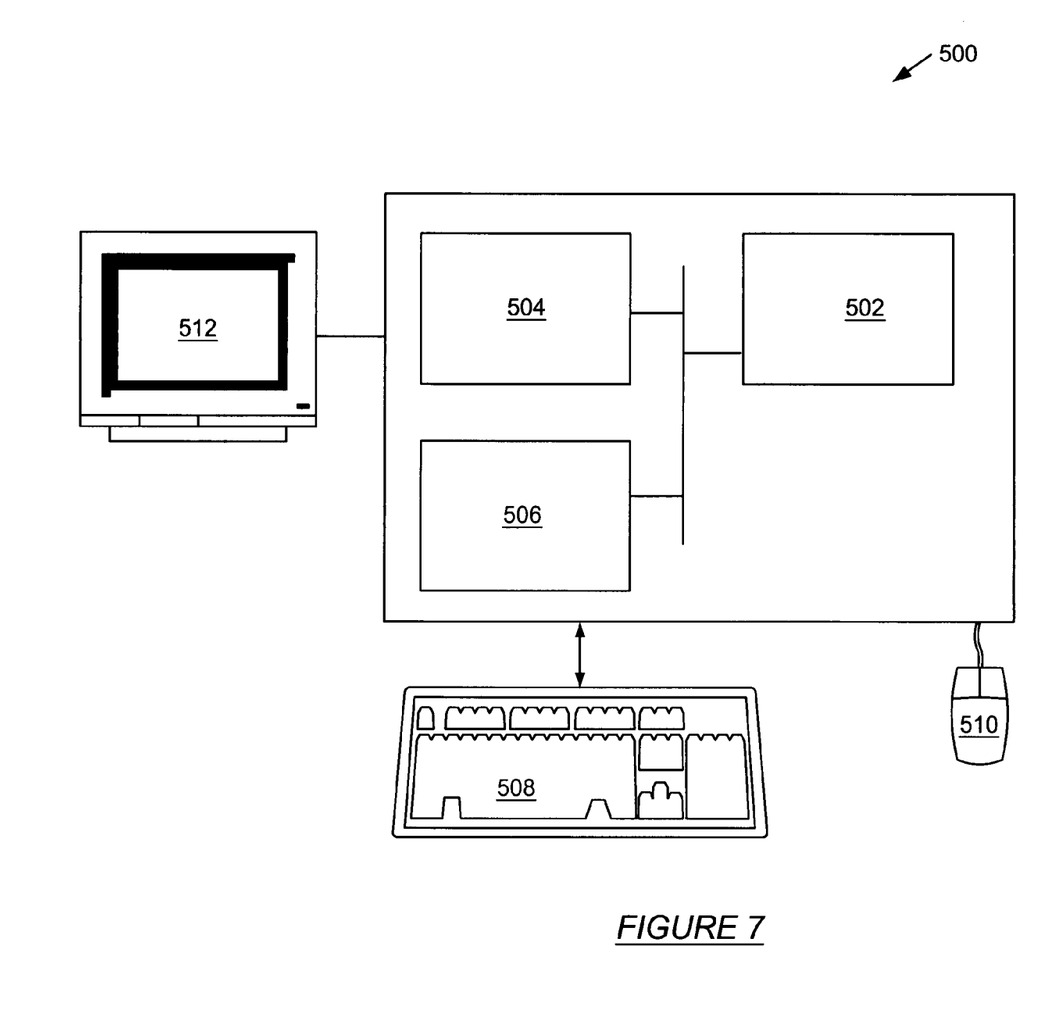
FIG. 7 shows a computer system in accordance with an embodiment of the invention.

The invention may be implemented on virtually any type of computer regardless of the platform being used. For example, as shown in FIG. 7, a computer system (500) includes a processor (502), associated memory (504), a storage device (506), and numerous other elements and functionalities typical of today's computers (not shown). The computer (500) may also include input means, such as a keyboard (508) and a mouse (510), and output means, such as a monitor (512). The computer system (500) is connected to a local area network (LAN) or a wide area network (e.g., the Internet) (not shown) via a network interface connection (not shown). Those skilled in the art will appreciate that these input and output means may take other forms.

Further, those skilled in the art will appreciate that one or more elements of the aforementioned computer (500) may be located at a remote location and connected to the other elements over a network. Further, the invention may be implemented on a distributed system having a plurality of nodes, where each portion of the invention (e.g., the SPA, the DMU, the storage pool, etc.) may be located on a different node within the distributed system. In one embodiment of the invention, the node corresponds to a computer system. Alternatively, the node may correspond to a processor with associated physical memory.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for storing a file comprising:
  receiving a request to store the file in a storage pool,
  obtaining and compressing a first portion of the file to obtain a first compressed data block;
  obtaining and compressing a second portion of the file to a second compressed data block;
  generating a first compressing header for the first compressed data block;
  generating a second compression header for the second compressed data block;
  combining the first compressed data block and the first compression header to obtain a first compressed data block package;
  storing the first compressed data block package in a storage pool at a first location;
  combining the second compressed data block and the second compression header to obtain a second compressed data block package;
  storing the second compressed data block package in the storage pool at a second location;
  calculating a first checksum for the first compressed data block;
  calculating a second checksum for the second compressed data block; and
  building a first indirect block comprising the first location, the first checksum, the second location, and the second checksum, a first set compression flag indicating that the first location comprises the first compressed data block, and a second set compression flag indicating that the second location comprises the second compressed data block;
  storing the first indirect block in the storage pool at a third location;
  building a second indirect block comprising the third location and a first non-set compression flag indicating that the third location includes an uncompressed first indirect block; and
  storing the second indirect block in the storage pool at a fourth location,
  wherein the first location, second location, third location, and fourth location are separate physical locations in the storage pool,
  wherein the first indirect block and the second indirect block are used to obtain the first compressed data block and the second compressed data block during a read operation.

2. The method of claim 1, further comprising:
  calculating a third checksum for the first indirect block, wherein the third checksum is stored in the second indirect block.

3. The method of claim 1, wherein the first compression header comprises a compressed size of the first compressed data block, an uncompressed size of a first data block corresponding to the first compressed data block, and information about the compression algorithm used to compress the first data block corresponding to the first compressed data block.

4. The method of claim 1, wherein a storage pool allocator includes functionality to compress first data block to obtain the first compressed data block.

5. The method of claim 1, wherein the storage pool comprises at least one storage device.

6. The method of claim 1, wherein storing the first compressed data block package comprises using a storage pool allocator.

7. A computer system for storing a file comprising:
  a processor;
  a memory;
  a storage device; and
  software instructions stored in the memory for enabling the computer system under control of the processor, to:
    receive a request to store the file in the storage pool,
    obtain and compress a first portion of the file to obtain a first compressed data block;
    obtain and compress a second portion of the file to a second compressed data block;
    generate a first compression header for the first compressed data block;
    generate a second compression header for the compressed data block;
    combine the first compressed data block and the first compression header to obtain a first compressed data block package;

store the first compressed data block package in a storage pool at a first location;

combine the second compressed data block and the second compression header to obtain a second compressed data block package;

store the second compressed data block package in the storage pool at a second location;

calculate a first checksum for the first compressed data block;

calculate a second checksum for the second compressed data block; and build a first indirect block comprising the first location, the first checksum, the second location, and the second checksum, a first set compression flag indicating the first location comprises the first compressed data block, and a second set compression flag indicating that the second location comprises the second compressed data block;

store the first indirect block in the storage pool at a third location;

build a second indirect block comprising the third location and a first non-set compression flag indicating that the third location includes an uncompressed first indirect block; and store the second indirect block in the storage pool at a fourth location, wherein the first location, second location, third location, and fourth location are separate physical locations in the storage pool, wherein the first indirect block and the second indirect block are used to obtain the first compressed data block and the second compressed data block during a read operation.

8. The computer system of claim 7, further comprising instructions to:

calculate a third checksum for the first indirect block, wherein the third checksum is stored in the second indirect block.

9. The computer system of claim 7, wherein the first compression header comprises a compressed size of the first compressed data block, an uncompressed size of a first data block corresponding to the first compressed data block, and information about the compression algorithm used to compress the first data block corresponding to the first compressed data block.

10. The computer system of claim 7, wherein a storage pool allocator includes functionality to compress first data block to obtain the first compressed data block.

11. The computer system of claim 7, wherein the storage pool comprises at least one storage device.

12. The computer system of claim 7, wherein storing the first compressed data block package comprises using a storage pool allocator.

* * * * *

UNITED STATES PATENT AND TRADEMARK OFFICE
CERTIFICATE OF CORRECTION

| | |
|---|---|
| PATENT NO. | : 7,496,586 B1 |
| APPLICATION NO. | : 10/853868 |
| DATED | : February 24, 2009 |
| INVENTOR(S) | : Jeffrey S. Bonwick et al. |

It is certified that error appears in the above-identified patent and that said Letters Patent is hereby corrected as shown below:

Claim 1, column 11, line 58, the word "compressing" should be

--compression--.

Signed and Sealed this

Fourteenth Day of April, 2009

JOHN DOLL
*Acting Director of the United States Patent and Trademark Office*